United States Patent
Gektin et al.

(10) Patent No.: US 7,791,194 B2
(45) Date of Patent: Sep. 7, 2010

(54) COMPOSITE INTERCONNECT

(75) Inventors: Vadim Gektin, San Jose, CA (US); David W. Copeland, Mountain View, CA (US)

(73) Assignee: Oracle America, Inc., Redwood City, CA (US)

( * ) Notice: Subject to any disclaimer, the term of this patent is extended or adjusted under 35 U.S.C. 154(b) by 170 days.

(21) Appl. No.: 12/101,077

(22) Filed: Apr. 10, 2008

(65) Prior Publication Data

US 2009/0256255 A1  Oct. 15, 2009

(51) Int. Cl.
*H01L 23/488* (2006.01)

(52) U.S. Cl. .................. 257/734; 257/673; 257/774; 257/E23.001

(58) Field of Classification Search .......... 257/738, 257/734, E23.023
See application file for complete search history.

(56) References Cited

U.S. PATENT DOCUMENTS

2006/0243480 A1* 11/2006 Kasahara et al. ............ 174/260
2007/0128883 A1* 6/2007 Hwang ........................ 438/775
2008/0247930 A1* 10/2008 Hotto .......................... 423/262
2009/0152659 A1* 6/2009 Hiltunen et al. .............. 257/432

\* cited by examiner

*Primary Examiner*—Fernando L Toledo
*Assistant Examiner*—Mamadou Diallo
(74) *Attorney, Agent, or Firm*—Osha Liang LLP

(57) ABSTRACT

A composite interconnect system includes a plurality of carbon nanotubes, a plurality of solder balls and standoff balls disposed on a first device to provide a connection to a second device. A die-attached substrate includes a substrate and one or more die disposed on the substrate by a die-attach composite interconnect. The die-attach composite interconnect includes a plurality of carbon nanotubes, solder bumps, and standoff balls disposed on the die to provide one or more connections to the substrate. A PCB-attached substrate package includes a substrate package and one or more die disposed on the substrate package. The substrate package is disposed on a PCB by a PCB-attach composite interconnect. The PCB-attach composite interconnect includes a plurality of carbon nanotubes, solder balls, and standoff balls disposed on the substrate package to provide one or more connections to the PCB.

20 Claims, 1 Drawing Sheet

COMPOSITE INTERCONNECT

BACKGROUND OF INVENTION

Conventional semiconductor fabrication involves the production of a number of ideally identical semiconductor devices on a silicon wafer. The process of wafer dicing is utilized to separate the discrete semiconductor devices, also known as die, from the silicon wafer. The die are subsequently prepared and placed in circuit through direct connection to a printed circuit board ("PCB") or mounted on a substrate package that is then placed in circuit. The electrical and mechanical connection of the die to a PCB or a die to a substrate package is referred to as die-attach, also known as the level one ("L1") interconnect. The die prepared and mounted on a substrate package is placed in circuit through direct connection of the die-attached substrate package to the PCB through the use of a conventional interconnect, for example, Pin Grid Array ("PGA") or Ball Grid Array ("BGA"), or through the use of a connector, socket, or interposer. The electrical and mechanical connection of the die-attached substrate package to a PCB is referred to as PCB-attach, also known as the level two ("L2") interconnect.

Die-attach is typically achieved through the use of wire-bonding or the use of flip-chip technology. In the case of wire-bonding, each die is prepared with metalized pads on the surface of the die. The metalized pads on the surface of the die are then connected to the pads of the PCB or the substrate by small wires that provide the required connectivity. The wires are typically comprised of gold, aluminum, or copper and have a diameter of micrometers ("µm"). The wires are typically connected to the pad by some combination of heat, pressure, and ultrasonic energy resulting in an electrically conductive joint.

In the case of flip-chip technology, each die is prepared with metalized pads on the surface of the die. Solder bumps, small spheres of solder, are deposited on the metalized pads of the die. The side of the die with the solder bumps is then flipped over so that the solder bumps can be mated with the substrate, or possibly a PCB. The solder bumps are then re-melted to establish an electrical and mechanical connection, typically using an ultrasound process. After re-melting the solder bumps, there is typically a small amount of space between the die and the substrate or PCB. Typically, an insulating material is flooded, through a process referred to as underfilling, between the die and the substrate or PCB.

PCB-attach is typically achieved through the use of through-hole placement or surface mount technology ("SMT"). In the case of through-hole placement, the metal pins of a package, connector, socket, or interposer are mated with corresponding metalized holes in the PCB. The through-hole package, connector, socket, or interposer is placed on the PCB such that the metal pins extend through the corresponding metalized holes in the PCB. The electrical and mechanical connection between the metal pins and the metalized holes of the PCB is typically achieved through the process of wave soldering. The semiconductor device may be placed in circuit by making the appropriate connection between the die-attached substrate through-hole package and the PCB or between the die-attached substrate package and the connector, socket, or interposer that is PCB-attached to the PCB.

In the case of SMT, a die-attached substrate package, for example a BGA package comprised, is mounted directly on corresponding metalized pads on the surface of a PCB that are covered in solder paste. The PCB is then reflowed to establish the electrical and mechanical connection between the die-attached substrate package and the metalized pads on the surface of the PCB.

SUMMARY OF INVENTION

According to one aspect of one or more embodiments of the present invention, a composite interconnect system comprising a plurality of carbon nanotubes, a plurality of solder balls, and a plurality of standoff balls wherein the carbon nanotubes, solder balls, and standoff balls are disposed on a first device to provide a connection to a second device.

According to one aspect of one or more embodiments of the present invention, a die-attached substrate comprising a substrate, and one or more die disposed on the substrate by a die-attach composite interconnect. The die-attach composite interconnect comprising a plurality of carbon nanotubes, a plurality of solder bumps and a plurality of standoff balls, wherein the carbon nanotubes, solder bumps, and standoff balls are disposed on the die to provide one or more connections to the substrate.

According to one aspect of one or more embodiments of the present invention, a PCB-attached substrate package comprising a substrate package and one or more die disposed on the substrate package. The substrate package is disposed on a PCB by a PCB-attach composite interconnect, the PCB-attach composite interconnect comprising a plurality of carbon nanotubes, a plurality of solder balls, and a plurality of standoff balls, wherein the carbon nanotubes, solder balls, and standoff balls are disposed on the die substrate package to provide one or more connections to the PCB.

Other aspects of the present invention will be apparent from the following description and the appended claims.

DETAILED DESCRIPTION

Figure 1:
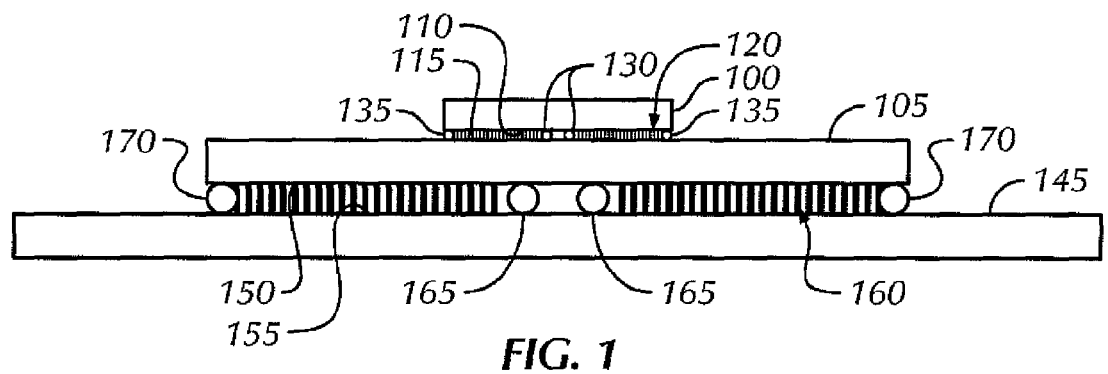
FIG. 1 shows a die-attached substrate package that is PCB-attached in accordance with one or more embodiments of the present invention.

Specific embodiments of the invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

Carbon nanotubes are allotropes of carbon, resulting in a nanostructure characterized by a diameter that is typically mere nanometers ("nms") and a length-to-diameter ratio that typically exceeds $1 \times 10^6$.

Carbon nanotubes are typically categorized as single-walled nanotubes ("SWNTs") and multi-walled nanotubes ("MWNTs"). SWNTs may be described as a single graphene sheet rolled into a seamless cylinder whose ends are either open or closed. When closed, the ends are capped by either half fullerenes or more complex structures including pentagons. MWNTs are multiple concentric cylinders of graphene sheets. The cylinders are of successively larger diameter to fit one inside another, forming a layered composite tube bonded together by van der Waals forces, with a typical distance of approximately 0.34 nm between layers.

Carbon nanotubes are commonly prepared by arc discharge between carbon electrodes in an inert gas atmosphere. The product is generally a mixture of single-wall and multi-wall nanotubes, although the formation of SWNTs can be favored by use of transition metal catalysts such as iron or cobalt. One of ordinary skill in the art will recognize that there are a number of other methods by which carbon nanotubes can be synthesized. Additionally, one of ordinary skill in the art will recognize that there are a number of other methods for synthesizing inorganic nanotubes that may provide functionality equivalent to that of carbon nanotubes.

The surface of carbon nanotubes may be modified prior to incorporation into the composites of the present invention. In one or more embodiments of the present invention, the nanostructured carbon material may be modified by a chemical means to yield derivatized nanostructured carbon material. Derivatization refers to the attached of other chemical entities to the nanostructured carbon material, which may be by chemical or physical means including, but not limited to, covalent bonding, van der Waals forces, electrostatic forces, physical entanglement, and any combinations thereof. In one or more embodiments of the present invention, the nanostructured carbon material may be modified by a physical means including plasma treatment, heat treatment, ion bombardment, attrition by impact, milling, and any combinations thereof.

In one or more embodiments of the present invention, the nanostructured carbon material may be modified by a chemical means including chemical etching by acids either in liquid or gaseous form, chemical etching by bases either in liquid or gaseous form, electrochemical treatments, and any combination thereof.

Carbon nanotubes offer high electrical conductivity (low electrical resistance), high thermal conductivity, and are mechanically compliant.

With reference to FIG. 1, a die-attached substrate package that is PCB-attached in accordance with one or more embodiments of the present invention is shown. The die-attach, or L1 interconnect, is the connection of the die 100 to the substrate 105 by a composite interconnect. The die 100 is oriented such that the die pads 110 are facing the corresponding die mounting pads 115 on the substrate 105, analogous to conventional flip-chip orientation.

A plurality of die-attach carbon nanotubes 120 are disposed on one or more die pads 110. One of ordinary skill in the art will recognize that there are a variety of ways in which carbon nanotubes may be disposed on a die pad. One or more die-attach solder bumps 130 may be disposed on one or more die pads 110. In one or more embodiments of the present invention, the die-attach solder bumps 130 may be placed in the center of the die pads 110. One or more die-attach standoff balls 135 may be disposed on one or more die pads 110. The die-attach standoff balls 135 provide co-planarity between the die 100 and the substrate 105 and help prevent the collapse of the die-attach solder bumps 130. In one or more embodiments of the present invention, the die-attach standoff balls 135 may be placed on the corners of the die.

One of ordinary skill in the art will recognize that there are a variety of die-attach solder bumps 130 and die-attach standoff balls 135 that could be utilized in accordance with one or more embodiments of the present invention. Additionally, one of ordinary skill in the art will recognize that there are a variety of ways in which the die-attach solder bumps 130, and die-attach standoff balls 135 could be disposed on one or more die pads 110 in accordance with one or more embodiments of the present invention.

The die 100 is oriented such that the die pads 110 face the corresponding die mounting pads 115. The die-attach carbon nanotubes 120 disposed on the die pads 110 make contact with the corresponding die mounting pads 115 such that the requisite connectivity is made. The die-attach carbon nanotubes 120 require some measure of compressive force. In one or more embodiments of the present invention, the die-attach solder bumps 130 are reflowed and collapse in a controller manner, providing compressive force to the die-attach carbon nanotubes 120. One of ordinary skill in the art will recognize that the requisite compressive force could be provided by other means.

The PCB-attach, or L2 interconnect, is the connection of the die-attached substrate 140 to the PCB 145 by a composite interconnect. The die-attached substrate 140 is oriented such that the substrate mounting pads 150 are facing the corresponding PCB pads 155.

A plurality of PCB-attach carbon nanotubes 160 are disposed on one or more substrate pads 150. One of ordinary skill in the art will recognize that there are a variety of ways in which carbon nanotubes may be disposed on a substrate pad. Additionally, one of ordinary skill in the art will recognize that the PCB-attach carbon nanotubes 160 could be disposed on one or more PCB pads 155. One or more PCB-attach solder balls 165 may be disposed on one or more substrate mounting pads 150. In one or more embodiments of the present invention, the PCB-attach solder balls 165 may be placed in the center of the substrate mounting pads 150. One or more PCB-attach standoff balls 170 may be disposed on one or more substrate mounting pads 150. The PCB-attach standoff balls 170 provide co-planarity between the die-attached substrate 140 and the PCB 145 and help prevent the collapse of the PCB-attach solder balls 165. In one or more embodiments of the present invention, the PCB-attach standoff balls 170 may be placed on the corners of the substrate.

One of ordinary skill in the art will recognize that there are a variety of PCB-attach solder balls 165, and PCB-attach standoff balls 170 that could be utilized in accordance with one or more embodiments of the present invention. Additionally, one of ordinary skill in the art will recognize that there are a variety of ways in which the PCB-attach solder balls 165, and PCB-attach standoff balls 175 could be disposed on one or more substrate mounting pads 150 in accordance with one or more embodiments of the present invention.

The die-attached substrate 140 is oriented such that the substrate mounting pads 150 face the corresponding PCB pads 155. The PCB-attach carbon nanotubes 160 disposed on the substrate mounting pads 150 make contact with the corresponding PCB pads 155. The PCB-attach carbon nanotubes 160 require some measure of compressive force. In one or more embodiments of the present invention, the PCB-attach solder balls 165 are reflowed and collapse in a controller manner, providing compressive force to the PCB-attach carbon nanotubes 160. One of ordinary skill in the art will recognize that the requisite compressive force could be provided by other means.

Figure 2:
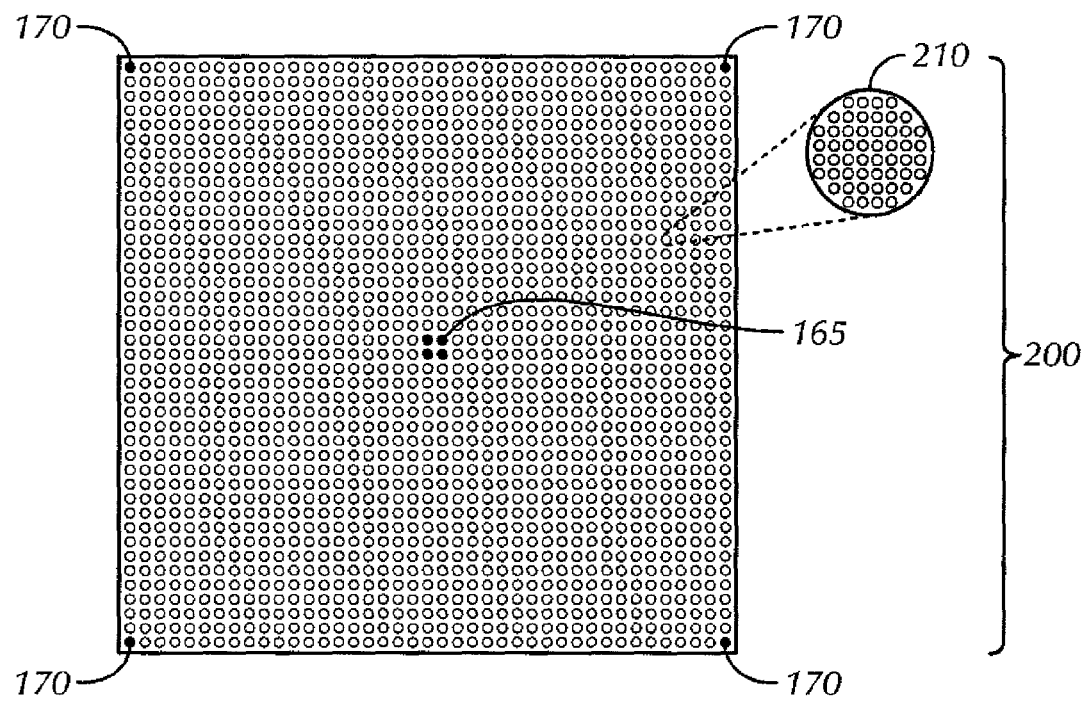
FIG. 2 shows the PCB connecting side of a die-attached substrate package in accordance with one or more embodiments of the present invention.

With reference to FIG. 2, the PCB connecting side of a die-attached substrate package in accordance with one or more embodiments of the present invention is shown. The die-attached substrate package 200 is a ceramic, organic, or other substrate package upon which a die is die-attached using either conventional interconnects or the composite interconnect of the claimed invention. A plurality of PCB-attach carbon nanotubes 160 are disposed on the substrate mounting pads 150. In one or more embodiments of the present invention, the PCB-attach carbon nanotubes 160 may be organized as a cluster of carbon nanotubes 210 such that the cluster connects to a single PCB pad 155. One of ordinary skill in the art will recognize that the number of discrete PCB-attach carbon nanotubes 160 that form the cluster may vary according to the design. Additionally, one of ordinary skill in the art will recognize that the pattern or arrangement of the discrete PCB-attach carbon nanotubes 160 may vary according to the design.

One or more PCB-attach solder balls 165 may be disposed on one or more substrate mounting pads 150. In one or more embodiments of the present invention, the PCB-attach solder balls 165 may be placed in the center of the substrate mounting pads 150. One or more PCB-attach standoff balls 170 may be disposed on one or more substrate mounting pads 150. In one or more embodiments of the present invention, one or more PCB-attach standoff balls 170 may be placed on each corner of the die-attached substrate package 200.

Advantages of one or more embodiments of the present invention may include one or more of the following.

In one or more embodiments of the present invention, the composite interconnect may provide for increased interconnect reliability for die-attach without underfilling the die area with an insulating material.

In one or more embodiments of the present invention, the composite interconnect may provide increased interconnect reliability for PCB-attach without the use of connectors, sockets, or interposers.

In one or more embodiments of the present invention, the composite interconnect may provide for increased interconnect reliability.

In one or more embodiments of the present invention, the composite interconnect may provide for increased interconnect density.

In one or more embodiments of the present invention, the composite interconnect may allow for the use of smaller package sizes.

In one or more embodiments of the present invention, the composite interconnect may provide for improved material interface with die, substrates, or PCBs.

In one or more embodiments of the present invention, the composite interconnect allows for greater variation in materials than that of conventional interconnects.

In one or more embodiments of the present invention, the composite interconnect may accommodate variations in height (z-axis) and planar location (x- and y-axis) without stressing the die, the substrate, the package, or the PCB.

In one or more embodiments of the present invention, the composite interconnect may provide for improved power delivery.

In one or more embodiments of the present invention, the composite interconnect may provide for improved thermal management.

In one or more embodiments of the present invention, the composite interconnect may provide for the delivery of high power to a semiconductor device while minimizing the area required by conventional interconnects.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A composite interconnect system comprising:
   a plurality of carbon nanotubes;
   a plurality of solder balls; and
   a plurality of standoff balls;
   wherein each of the plurality of carbon nanotubes, solder balls, and standoff balls are disposed on a first device to provide a connection to a second device.

2. The composite interconnect of claim 1, wherein the carbon nanotubes are single walled carbon nanotubes.

3. The composite interconnect of claim 1, wherein the carbon nanotubes are multi-walled carbon nanotubes.

4. The composite interconnect of claim 1, wherein the carbon nanotubes are organically synthesized.

5. The composite interconnect of claim 1, wherein one or more carbon nanotubes form a cluster that acts as a discrete electrical conductor.

6. The composite interconnect of claim 1, wherein one or more carbon nanotubes form a cluster that acts as a discrete thermal conductor.

7. The composite interconnect of claim 1, wherein the solder balls provide compressive force on one or more of the carbon nanotubes.

8. The composite interconnect of claim 1, wherein the standoff balls provide co-planarity between the first device and the second device, and prevent the solder balls from collapsing in an uncontrolled manner.

9. A die-attached substrate comprising:
   a substrate; and
   one or more die disposed on the substrate by a die-attach composite interconnect;
   the die-attach composite interconnect comprising:
      a plurality of carbon nanotubes,
      a plurality of solder bumps and
      a plurality of standoff balls,
      wherein each of the plurality of carbon nanotubes, solder bumps, and standoff balls are disposed on the die to provide one or more connections to the substrate.

10. The die-attached substrate of claim 9, wherein the carbon nanotubes are single walled carbon nanotubes.

11. The die-attached substrate of claim 9, wherein the carbon nanotubes are multi-walled carbon nanotubes.

12. The die-attached substrate of claim 9, wherein the carbon nanotubes are organically synthesized.

13. The die-attached substrate of claim 9, wherein one or more carbon nanotubes form a cluster that acts as a discrete electrical conductor.

14. The die-attached substrate of claim 9, wherein one or more carbon nanotubes form a cluster that acts as a discrete thermal conductor.

15. The die-attached substrate of claim 9, wherein the solder bumps provide compressive force on one or more of the carbon nanotubes.

16. The die-attached substrate of claim 9, wherein the standoff balls provide co-planarity between the first device and the second device, and prevent the solder bumps from collapsing.

17. The die-attached substrate of claim 9, wherein the die-attached substrate is PCB-attached to a PCB by a PCB-attach composite interconnect, the PCB-attach composite interconnect comprising:
   a plurality of carbon nanotubes;
   a plurality of solder balls; and
   a plurality of standoff balls;
   wherein each of the plurality of carbon nanotubes, solder balls, and standoff balls are disposed on the die-attached substrate to provide one or more connections to the PCB.

18. The die-attached substrate of claim 17, wherein one or more carbon nanotubes of the PCB-attach composite interconnect form a cluster that acts as a discrete electrical conductor.

19. The die-attached substrate of claim 17, wherein one or more carbon nanotubes of the PCB-attach composite interconnect form a cluster that acts as a discrete thermal conductor.

20. A PCB-attached substrate package comprising:
a substrate package; and
one or more die disposed on the substrate package;
wherein the substrate package is disposed on a PCB by a PCB-attach composite interconnect, the PCB-attach composite interconnect comprising:
a plurality of carbon nanotubes,
a plurality of solder balls, and
a plurality of standoff balls,
wherein each of the plurality of carbon nanotubes, solder balls, and standoff balls are disposed on the die substrate package to provide one or more connections to the PCB.

* * * * *